United States Patent [19]

Yamamoto

[11] Patent Number: 5,559,045
[45] Date of Patent: Sep. 24, 1996

[54] METHOD OF FABRICATING VERTICAL-TYPE DOUBLE DIFFUSED MOSFET HAVING A SELF-ALIGNED FIELD OXIDE FILM

[75] Inventor: Masanori Yamamoto, Tokyo, Japan

[73] Assignee: NEC Corporation, Tokyo, Japan

[21] Appl. No.: 409,614

[22] Filed: Feb. 13, 1995

Related U.S. Application Data

[63] Continuation of Ser. No. 933,249, Aug. 21, 1992, abandoned.

[30] Foreign Application Priority Data

Aug. 22, 1991 [JP] Japan .................................. 3-209700

[51] Int. Cl.$^6$ .................................................. H01L 21/265
[52] U.S. Cl. .............................. 437/34; 437/41; 437/57; 437/58; 437/69
[58] Field of Search ........................ 437/34, 41, 69, 437/57, 58; 257/328, 338, 336, 335

[56] References Cited

U.S. PATENT DOCUMENTS

| | | | |
|---|---|---|---|
| 4,434,543 | 3/1984 | Schwabe et al. | 437/34 |
| 4,558,508 | 12/1985 | Kinney et al. | 437/34 |
| 4,829,019 | 5/1989 | Mitchell et al. | 437/69 |
| 5,024,961 | 6/1991 | Lee et al. | 437/34 |
| 5,032,530 | 7/1991 | Lowrey et al. | 437/34 |
| 5,072,267 | 12/1991 | Hattori | 257/338 |
| 5,118,641 | 6/1992 | Roberts | 437/69 |
| 5,132,241 | 7/1992 | Su | 437/69 |
| 5,141,882 | 8/1992 | Komori et al. | 437/34 |

FOREIGN PATENT DOCUMENTS

| | | | |
|---|---|---|---|
| 0046552 | 2/1987 | Japan | 437/34 |

*Primary Examiner*—George Fourson
*Assistant Examiner*—Long Pham
*Attorney, Agent, or Firm*—Burns, Doane, Swecker & Mathis, L.L.P.

[57] ABSTRACT

Disclosed are an improved vertical-type double diffused MOSFET which has a self-aligned gate structure and field oxide film and a method of fabricating the same. A silicon nitride film is selectively formed and a well region is formed, after which a self-aligned field oxide film is formed on the well region. After removing the silicon nitride film, a self-aligned gate oxide film is formed on an element formation area opposite to the well region. The self-aligned field oxide film overlays the well region. A gate structure has a stable low resistance caused by a desirable definition thereof. While, the self-aligned gate oxide film overlays the element formation area, but which has no overlaying area on the well region and the edge portion of the gate oxide film exists in the vicinity of the edge portion of the well region. The gate oxide film has a few crystal defects thereby reducing the gate short.

2 Claims, 4 Drawing Sheets

METHOD OF FABRICATING VERTICAL-TYPE DOUBLE DIFFUSED MOSFET HAVING A SELF-ALIGNED FIELD OXIDE FILM

This application is a continuation of Application Ser. No. 07/933,249, filed Aug. 21, 1992 now abandoned.

BACKGROUND OF THE INVENTION

The invention relates to a vertical-type double diffused MOSFET and a method of fabricating the same.

FIGS. 1A to 1D illustrate conventional fabrication processes of a vertical-type double diffused MOSFET. In FIG. 1A, a n$^-$-type epitaxial layer 2 is formed on a silicon substrate 1. The n$^-$-type epitaxial layer 2 is subjected to a thermal oxidization to form an oxide silicon film 17 having a thickness in the range from 600 to 1000 nm. Subsequently, openings are formed in a peripheral area B opposite to an element formation area A by use of photolithography. The openings are subjected to an ion-implantation and a heat treatment to form a p-type well region 5, after which a surface of the p-type well region 5 is subjected to a thermal oxidization to form an oxide silicon film 18 having a thickness in the range from 400 to 600 nm. Subsequently, both a part of the oxide silicon film 18 and the oxide silicon film 17 are removed by use of photolithography. Further, a gate oxide film 7a is formed by use of a thermal oxidization on the element formation area A in which oxide silicon films 17 and 18 have been removed. At this time, the remaining oxide silicon film 18 is also subjected to a thermal oxidization to be made into a field oxide film 6a as shown in FIG. 1B.

In FIG. 1C, a polycrystalline silicon film 8 is deposited on an entire surface of the oxide films 7a and 6a, followed by patterning, so that the polycrystalline silicon film 8 may serve as a mask. An ion-implantation of boron of a concentration in the range from $6 \times 10^{13}$ to $14 \times 10^{13}$ cm$^{-2}$ is carried out by use of the mask, followed by a heat treatment to form p-type base regions 9.

In FIG. 1D, an ion-implantation is carried out by use of the polycrystalline silicon film 8 as the mask, followed by a heat treatment so that a n$^+$-type source region 10 is formed in the p-type base region 9. Further, an ion-implantation is carried out by use of a photoresist film as a mask, followed by a heat treatment to form a p$^+$-type back gate region 11 in the n$^+$-type source region 10. After that, an insulation layer 12 is deposited, followed by opening to form a source electrode 13 and a gate electrode 14. Further, a drain electrode is formed.

A conventional vertical-type double diffused MOSFET fabricated by the set forth processes is engaged with following disadvantage. FIGS. 2 and 3 illustrate two types of structures of the gate oxide film 7a and the field oxide film 6a in which the gate oxide film 7a overlays an edge portion of the p-type well region 5 in order to reduce a higher electric field so that the p-type base regions 9 take the same potential each other.

First, when openings of the photoresist film for the p-type well region 9 and openings of the photoresist film for the gate oxide film 7a overlap each other, a structure of oxide films shown in FIG. 2 is formed. Such a structure of the oxide films comprises a field oxide film 6a, a field oxide film 6b and a gate oxide film 7b. When the oxide silicon film 17 is etched to form the gate oxide film 7a, the photoresist film which overlays the field oxide film and an edge portion of the silicon oxide film 17 is so used as a mask that the edge portion of the silicon oxide film 17 remains. A thermal oxidization for the gate oxide film formation subjects the remaining edge portion of the silicon oxide film 17 to re-oxidization to form the field oxide film 6b. The field oxide film 6b provides a large difference in level thereby resulting in an undesirable definition of the polycrystalline silicon film 8 to be formed on the oxide films. The gate electrode, thus, has a variable high resistance.

Second, when there is no overlapping of openings of the photoresist film used for forming the p-type well region 9 and openings of the photoresist film used for forming the gate oxide film 7a, a structure of oxide films shown in FIG. 3 is formed. In this case, when the oxide silicon film 17 is etched to form the gate oxide film 7a, the photoresist film serving as a mask overlays the oxide film 18 only. Consequently, no field oxide film 6b is formed. A structure shown in FIG. 3 is not associated with a problem such as an undesirable definition of the polycrystalline silicon film 8 to be formed on the oxide films. The structure shown in FIG. 3 is, however, engaged with other problems such as a formation of a crystal defect. The ion-implantation and the heat treatment carried out for forming the n-type well region produces many crystal defects in an overlaid area C of the well region 5 with the gate oxide film 7a. Consequently, an overlaying area of the gate oxide film 7a also has a high concentration of crystal defects which causes a gate short.

SUMMARY OF THE INVENTION

Accordingly, it is a primary object of the present invention to provide an improved vertical-type double diffused MOSFET structure and a novel method for fabricating the same.

It is another object of the present invention to provide a vertical-type double diffused MOSFET structure without a gate short and a method of fabricating the same.

It is a further object of the present invention to provide a vertical-type double diffused MOSFET structure having an improved stability of a low gate electrode resistance and a method of fabricating the same.

The above and other objects, features, and advantages of the present invention will be apparent from following descriptions.

There is provided a vertical-type double diffused MOSFET which has an improved self-aligned gate structure and a self-aligned field oxide film and a method of fabricating the same.

In fabrication processes of the present invention, a surface of a silicon layer of one conductive type is subjected to a thermal oxidization to form a silicon oxide film. A silicon nitride film is formed on an entire surface of the silicon oxide film. Further, prepared is a photoresist film covering an element formation area. The silicon nitride film is etched under using the photoresist film as a mask. Subsequently, an ion-implantation is carried out so that an opposite conductive type dopant is introduced into the one conductive type silicon layer, followed by removing the photoresist film, after which a heat treatment is carried out to form an opposite conductive type well region in a peripheral area.

A surface of the opposite conductive type well region is subjected to a selective oxidization by using the silicon nitride film as a mask so that a field oxide film is formed on the opposite conductive type well region. Further, the silicon nitride film and the silicon oxide film are removed, after which a gate oxide film is formed by use of a thermal oxidization in the element formation area.

Subsequently, a polycrystalline silicon film is deposited on an entire surface of the device, after which the polycrystalline silicon film is subjected to patterning to be used as a mask for a boron ion-implantation. Then, a heat treatment is carried out to form an opposite conductive type base region. In addition, an ion-implantation is carried out by using the polycrystalline silicon film as a mask prior to a heat treatment so that a source region of the one conductive type is formed in the base region. In sequence, an ion-implantation is also carried out by using the polycrystalline silicon film as a mask prior to a heat treatment so that a back gate region of the opposite conductive type is formed in the source region.

Subsequently, a surface of the device is subjected to a deposition of an oxide film, followed by an opening formation. Then, an aluminium film is deposited on the device, followed by patterning, so that a source electrode is formed to be made into contact with the source region. In addition, a gate electrode is also formed to be made into contact with the polycrystalline silicon film. Finally, an aluminium film is deposited under the substrate, followed by patterning so that a drain electrode is formed.

In the structure, the self-aligned field oxide film overlays the well region formed in the peripheral area. The field oxide film has no projection at its edge portion. This results that the polycrystalline silicon film has no undesirable definition. The gate structure is, thus, associated with no disadvantage of the variable high resistance.

While, the self-aligned gate oxide film overlays the element formation area including the base region. The self-aligned gate oxide film has no overlaying area on the well region but the edge portion of the gate oxide film exists in the vicinity of the edge portion of the well region in order to reduce a higher electric field. The gate oxide film has a few crystal defects and the polycrystalline silicon film and the well region are separated by the thick field oxide film thereby reducing a gate short.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

A first preferred embodiment of the present invention will be described.

Figure 1A:
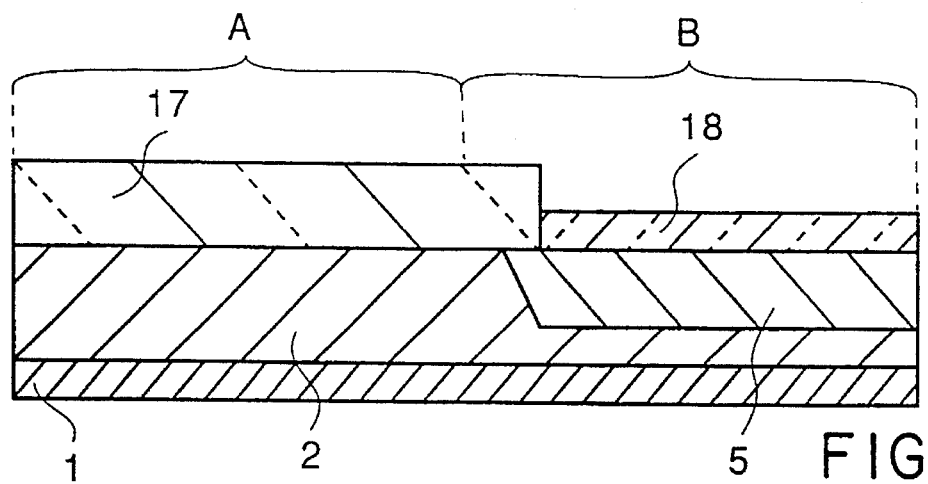
FIGS. 1A to 1D are fragmentary cross-sectional elevation views illustrative of sequential processes involved in the conventional method of fabricating the vertical-type double diffused MOSFET.
Figure 1B:
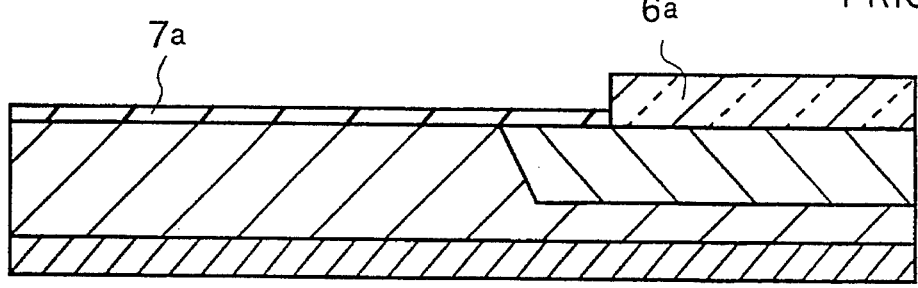
Figure 1C:
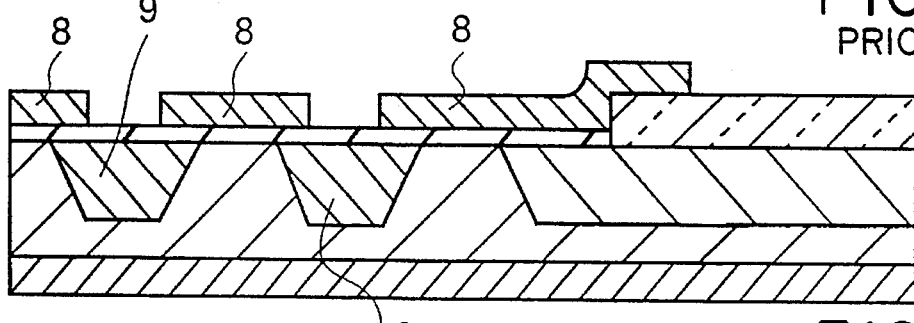
Figure 1D:
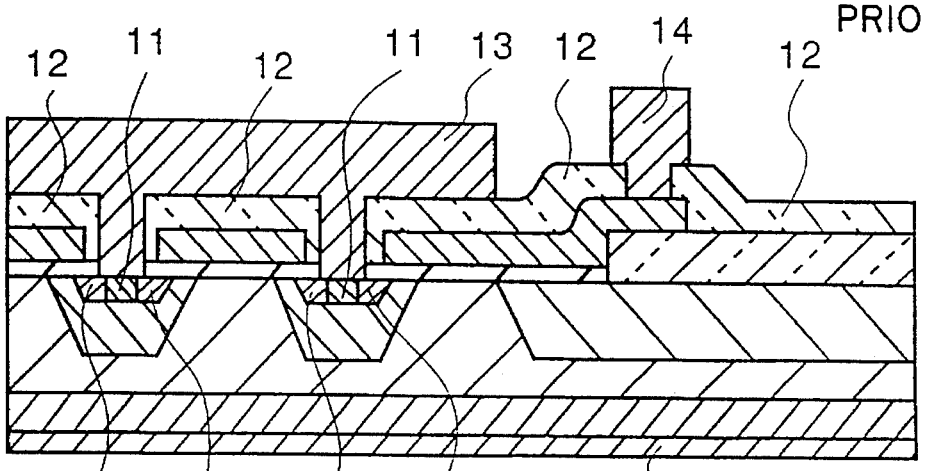
Figure 2:
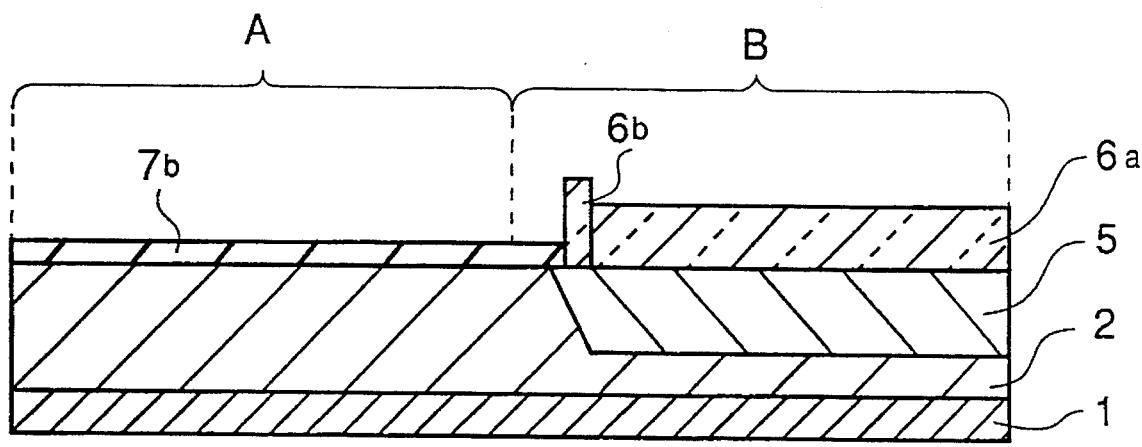
FIGS. 2 and 3 are fragmentary cross-sectional elevation views illustrative of problems in structures of a gate oxide film and a field oxide film of the conventional vertical-type double diffused MOSFET.
Figure 3:
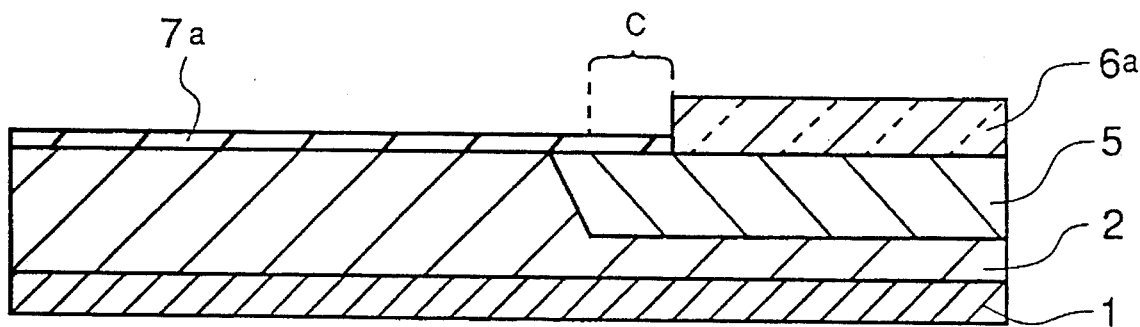
Figure 4A:
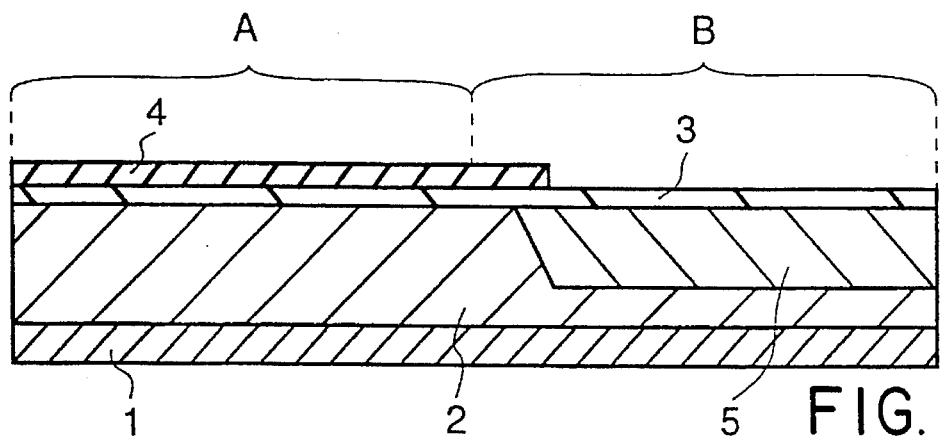
FIGS. 4A to 4D are fragmentary cross-sectional elevation views illustrative of sequential processes involved in a novel method of fabricating an improved vertical-type double diffused MOSFET.

In FIG. 4A, a $n^-$-type epitaxial silicon layer 2 is formed on a surface of a $n^+$-type silicon substrate 1. An entire surface of the $n^-$-type epitaxial silicon layer 2 is subjected to a thermal oxidization to form a silicon oxide film 3 having a thickness in the range from 20 to 100 nm. Subsequently, a silicon nitride film 4 is formed on the silicon oxide film 3 by use of a LPCVD method. Further, a photoresist film (not shown) is formed to cover both the element formation area A and the peripheral area B, after that the silicon nitride film 4 is subjected to etching by using the photoresist film as a mask. An ion-implantation of boron of a concentration in the range from $4\times10^{13}$ to $12\times10^{13}$ cm$^{-2}$ is carried out by using the photoresist film as a mask. After removing the photoresist film, a heat treatment is carried out at a temperature of 1200 degrees and for one hour to three hours or at a temperature of 1140 degrees and for two hours to six hours thereby resulting in a formation of a p-type well region 5.

Figure 4B:
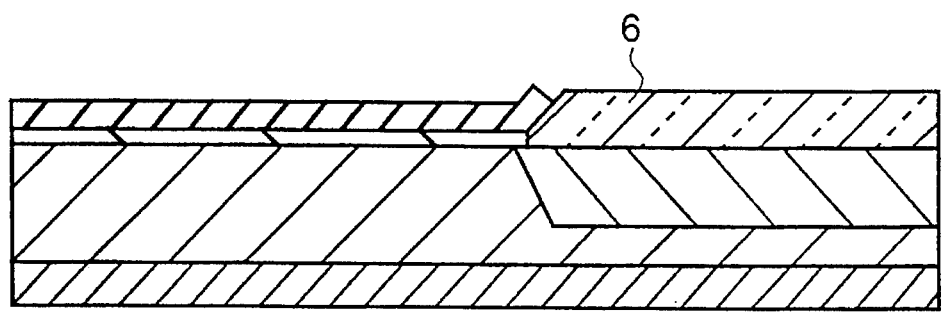

In FIG. 4B, a selective oxidization is carried out by use of the remaining silicon nitride film 4 as a mask whereby resulting in a formation of a self-aligned field oxide film 6 having a thickness in the range from 400 to 1000 nm. This prevents the set forth disadvantages such as the variable high resistance of the gate electrode which is caused by the undesirable definition of the polycrystalline silicon layer 8.

Figure 4C:
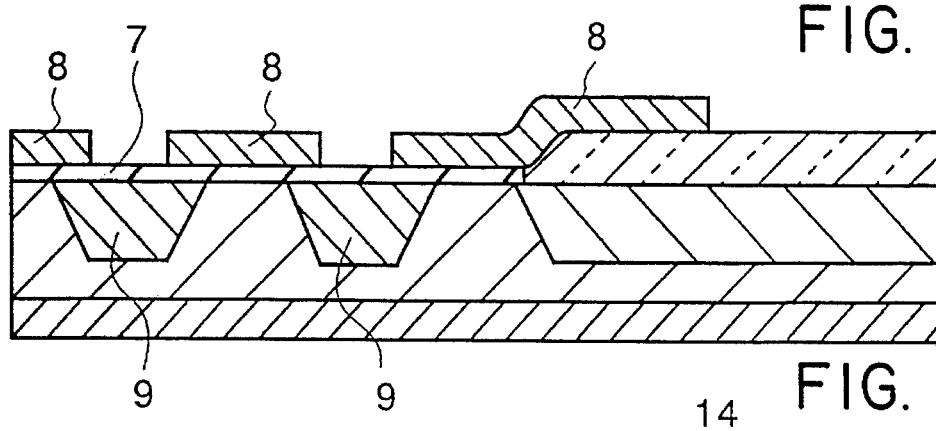

In FIG. 4C, the silicon nitride film 4 and the silicon oxide film 3 are subjected to etching to be removed, after which a thermal oxidization is carried out thereby resulting in a formation of a self-aligned gate oxide film 7. There is no superimposition of the gate oxide film 7 on the p-type well region 5. This permits reducing crystal defects of the gate oxide film 7. The field oxide film 6 overlays the p-type well region 5, while the gate oxide film has no overlapping area thereby permitting no gate short.

Subsequently, a polycrystalline silicon film 8 of a thickness of approximately 600 nm is deposited on an entire surface of the device, after which the polycrystalline silicon film 8 is subjected to patterning to be used as a mask for a boron ion-implantation of a concentration in the range from $6\times10^{13}$ to $14\times10^{13}$ cm$^{-2}$. Further, a heat treatment is carried out at a temperature of 1200 degrees and for one hour to three hours or at a temperature of 1140 degree and for two hours to six hours thereby resulting in a formation of a p-type base region 9. In addition, the set forth ion-implantation for forming the base region 9 is carried out by using the polycrystalline silicon film 8 as a mask prior to a heat treatment so as to reduce a crystal defect of the gate oxide film 7. Thus, the gate oxide film formed by using the polycrystalline silicon film 8 as a mask has a few crystal defects as compared with that subjected to an ion-implantation directly.

Figure 4D:
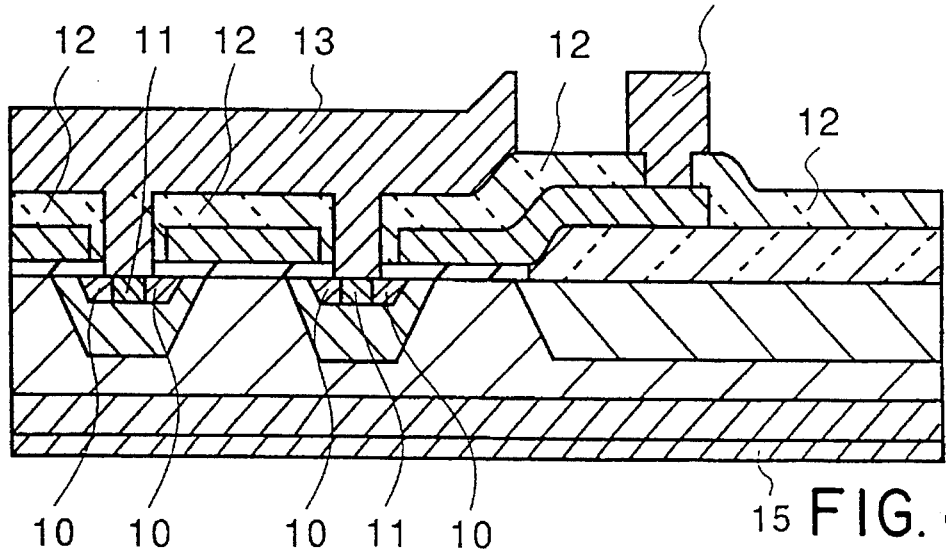

In FIG. 4D, an ion-implantation is carried out by using the polycrystalline silicon film 8 as a mask before a heat treatment, thereby resulting in a formation of a $n^+$-type source region 10 in the p-type base region 9. In sequence, an ion-implantation is also carried out by using the polycrystalline silicon film 8 as a mask prior to a heat treatment, whereby resulting in a formation of a $p^+$-type back gate region 11 in the $n^+$-type source region 10.

Subsequently, a surface of the device is subjected to a deposition of an oxide layer 12 of a thickness in the range from 500 to 1000 nm, followed by an opening formation. Further, an aluminium film of a thickness in the range from 1 to 3 micrometers is deposited on the device, followed by patterning thereby resulting in a formation of source electrode 13. The source electrode 13 is in connection with the $n^+$-type source region 10. A gate electrode is also formed to be made into contact with the polycrystalline silicon film 8. Finally, an aluminium film is deposited under the substrate 1, followed by patterning so as to form a drain electrode 15, whereby completing a formation of the device.

In the structure of an improved vertical-type double diffused MOSFET, the n⁻-type epitaxial silicon layer 2 is formed on the n⁺-type substrate 1. The p-type well region 5 is formed in the peripheral area B of the n⁻-type epitaxial silicon layer 2. While a plurality of the p-type base regions 9 are formed in the element formation area A. The n⁺-type source region 10 is formed in the p-type base region 9. Further, the p⁺-type back gate region 11 is formed in the source region 10. The drain electrode 15 is provided under the substrate 1.

The self-aligned field oxide film 6 which is formed by the selective oxidization overlays the p-type well region 5 formed in the peripheral area B. The field oxide film 6 has no projection at its edge portion. This results that the polycrystalline silicon film 8 connected with the gate electrode 14 has no undesirable definition. The gate structure is, therefore, engaged with no disadvantage of the variable high resistance.

While, the self-aligned gate oxide film 7 overlays the element formation area A including the base regions 9. The self-aligned gate oxide film 7 has no overlaying area on the p-type well region 5 but the edge portion of the gate oxide film 7 exists in the vicinity of the edge portion of the p-type well region 5 so as to reduce a higher electric field. The gate oxide film 7 has a few crystal defects and the polycrystalline silicon film 8 and the p-type well region 5 are separated by the thick field oxide film 6, whereby reducing the gate short.

Figure 5:
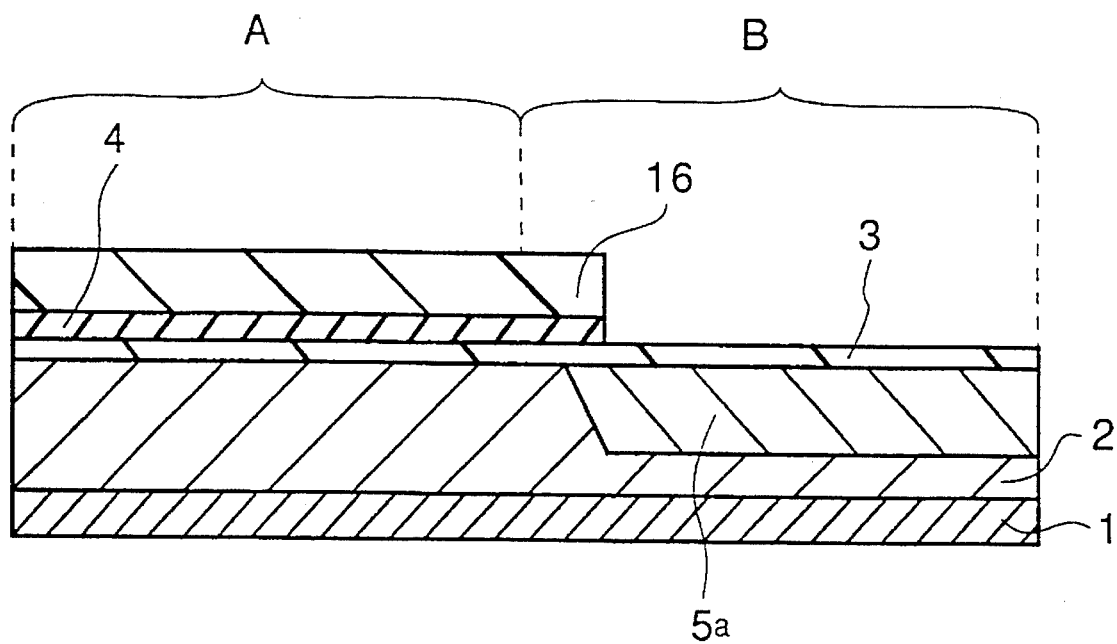
FIG. 5 is a fragmentary cross-sectional elevation view illustrative of one step in sequential processes involved in another novel method of fabricating an improved vertical-type double diffused MOSFET.

A second preferred embodiment of the present invention will now be described. In FIG. 5, a n⁻-type epitaxial silicon layer 2 is formed on a n⁺-type silicon substrate 1. A silicon oxide film 3 is formed on a surface of the n⁻-type epitaxial silicon layer 2, after which a silicon nitride film 4 is formed on the silicon oxide film 3. Subsequently, a photoresist film 16 having a thickness in the range from approximately 1 to 3 micrometers is prepared to cover both the element formation area A and the peripheral area B. Further, a high energy boron ion-implantation of approximately 2 MeV is carried out by using the photoresist film 16 as a mask. After removing the photoresist film 16, a heat treatment is carried out to form a p-type well region 5a. Such a high energy ion-implantation permits a short time heat treatment as compared with the normal ion-implantation, thereby resulting in a formation of a gate oxide film having a few crystal defects.

Following fabrication steps are analogous to that of the first embodiment. Referring back to FIG. 4B, a selective oxidization is carried out by use of the remaining silicon nitride film 4 as a mask so that a self-aligned field oxide film 6 is formed.

In FIG. 4C, after removing both the silicon nitride film 4 and the silicon oxide film 3, a thermal oxidization is carried out to form a self-aligned gate oxide film 7. Subsequently, a polycrystalline silicon film 8 is deposited on an entire surface of the device, after which the polycrystalline silicon film 8 is subjected to patterning so as to be used as a mask for a boron ion-implantation. Then, a heat treatment is carried out to form a p-type base region 9.

In FIG. 4D, an ion-implantation is carried out by using the polycrystalline silicon film 8 as a mask prior to a heat treatment so that a n⁺-type source region 10 is formed in the p-type base region 9. In sequence, an ion-implantation is also carried out by using the polycrystalline silicon film 8 as a mask prior to a heat treatment, so that a p⁺-type back gate region 11 is formed in the n⁺-type source region 10.

Subsequently, a surface of the device is subjected to a deposition of an oxide layer 12, followed by an opening formation. Then, an aluminium film is deposited on the device, followed by patterning so that a source electrode 13 is formed to be made into contact with the n⁺-type source region 10. In addition, a gate electrode 14 is also formed to be made into contact with the polycrystalline silicon film 8. Finally, an aluminium film is deposited under the substrate 1, followed by patterning so that a drain electrode 15 is formed.

The structure of the second embodiment is essentially the same as the first embodiment. The gate oxide film 7 has a few crystal defects as compared with that of the first embodiment because the short time heat treatment is available by using the high energy boron ion-implantation for forming the p-type well region.

Although, the set forth embodiments of the present invention are the vertical-type double diffused MOSFET of n-type, it will be understood that the set forth fabrication processes and the structure will be applicable to a vertical-type double diffused MOSFET of p-type. Further, the conditions of the fabrication processes and the dimension of the structure are variable by matching the requirements.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the sprite and scope of the invention.

What is claimed is:

1. A method of forming a vertical-type double diffused field effect transistor comprising the steps of:

covering a silicon layer of one conductivity type with a first silicon oxide film, said silicon layer having an element formation area and a peripheral area, wherein said first silicon oxide film has a first portion formed on said element formation area and a second portion formed on said peripheral area of said silicon layer;

forming a silicon nitride film on said first portion of said first silicon oxide film substantially excluding said second portion of said first silicon oxide layer;

introducing impurities into said peripheral area of said silicon layer except said element formation area of said silicon layer to thereby form a first region of a conductivity type opposite to said one conductivity type in said peripheral area;

thickening said second portion of a first silicon oxide film to form a second silicon oxide film by using said silicon nitride film as a mask, said second silicon oxide film being thereby formed on said first region;

removing said silicon nitride film and said first portion of said first silicon oxide film to expose a surface of said element formation area of said silicon layer with said second silicon oxide film remaining on said first region;

forming a gate oxide film on said surface of said element formation area of said silicon layer in contact with said second silicon oxide layer;

forming a conductive layer which has a portion formed on a part of said gate oxide film and is elongated over said second silicon oxide film; and forming a second region of said opposite conductivity type in said element formation area of said silicon layer at a distance from said first region.

2. The method as claimed in claim 1, wherein said silicon nitride film is formed by forming an original silicon nitride film on said first and second portions of said first silicon oxide film and then removing a portion of said original silicon nitride film from said second portion of said first silicon oxide film by using a photo-resist film formed on a remaining portion of said original silicon nitride film as a mask, and said impurities being implanted into said peripheral area of said silicon layer by using said photo-resist film as a mask.

* * * * *